United States Patent [19]

Hirae et al.

[11] Patent Number: 5,444,389
[45] Date of Patent: Aug. 22, 1995

[54] METHOD AND APPARATUS FOR MEASURING LIFETIME OF MINORITY CARRIERS IN SEMICONDUCTOR

[75] Inventors: Sadao Hirae; Motohiro Kouno; Takamasa Sakai, all of Kyoto, Japan

[73] Assignee: Dainippon Screen Mfg. Co., Ltd., Kyoto, Japan

[21] Appl. No.: 123,443

[22] Filed: Sep. 17, 1993

[30] Foreign Application Priority Data

Sep. 25, 1992 [JP] Japan .................. 4-280832

[51] Int. Cl.[6] ............................. G01R 31/00
[52] U.S. Cl. ................... 324/765; 324/754; 324/73.1; 324/661
[58] Field of Search ............... 324/158 R, 158 D, 754, 324/765, 661, 662, 663, 96, 73.1; 250/561, 307

[56] References Cited

U.S. PATENT DOCUMENTS

| | | | |
|---|---|---|---|
| 4,891,584 | 1/1990 | Kamieniecki | 324/158 R |
| 5,225,690 | 6/1993 | Sakai | 250/561 |
| 5,233,291 | 8/1993 | Kouno | 324/158 R |

FOREIGN PATENT DOCUMENTS 64-65849  3/1989  Japan .

OTHER PUBLICATIONS

Japanese Patent Laid-Open Gazette, Sho No. 64-65849 (Hei No. 1-65849), 161 E 778.
"The Pulsed MIS Capacitor," *Phys. Stat. Sol.,* vol. (a)89, pp. 13-43, 1985, by J. S. Kang and K. K. Schroeder.

*Primary Examiner*—Kenneth A. Wieder
*Assistant Examiner*—Mark A. Wardas
*Attorney, Agent, or Firm*—Ostrolenk, Faber, Gerb & Soffen

[57] ABSTRACT

A capacitor is connected to an insulating film on a semiconductor wafer. A high-frequency voltage with a bias is applied to the series combination of the semiconductor wafer and the capacitor. The bias voltage is changed stepwise, and the change of the total capacitance is measured. The minority carrier lifetime is calculated from the time-dependent change of the total capacitance.

14 Claims, 9 Drawing Sheets

METHOD AND APPARATUS FOR MEASURING LIFETIME OF MINORITY CARRIERS IN SEMICONDUCTOR

BACKGROUND OF THE INVENTION

1. Field of the Invention

The present invention relates to a method and an apparatus for measuring the lifetime of minority carriers in a semiconductor.

2. Description of the Related Art

Examination of lattice defects in a semiconductor is one of the important tests to be performed during semiconductor circuit manufacturing because lattice defects have a great influence on the electrical characteristics of the semiconductor. Since the lifetime of minority carriers in a semiconductor is strongly correlated to the density of the lattice defects, minority carrier lifetime is measured in order to evaluate the lattice defects. Conventionally, the so-called Zerbst method is used to measure the minority carrier lifetime. The Zerbst method is described in *Phys.*, vol. 22, p. 30, 1966, by M. Zerbst and Z. Agnew, and also in "The Pulsed MIS Capacitor," *Phys. Stat. Sol.*, Vol. (a)89, pp. 13–43, 1985, by J. S. Kang and D. K. Schroeder, which are expressly incorporated by reference herein.

FIGS. 8A through 8C schematically illustrate a method of measuring capacitance-transient characteristics, and deriving a C-t curve, according to the Zerbst method. In FIG. 8A, a semiconductor wafer 100 has a substrate 101 and an insulating film 102, or an oxidation film, formed on a surface of the substrate 101. A first electrode 200 is formed on the insulating film 102, so as to constitute a metal-insulator-semiconductor (MIS) diode. A second electrode 210 is formed on the other surface of the substrate 101. According to the Zerbst method, a high frequency voltage with a bias is applied between the first and the second electrodes 200 and 210 by an electrical power supply 300. The bias voltage is changed stepwise as shown in FIG. 8B, and a time-dependent change of the capacitance of the MIS diode, i.e. a C-t curve, is measured as shown in FIG. 8C. The minority carrier lifetime in the substrate 101 is determined through the analysis of the C-t curve.

The capacitance change of the MIS diode during the measurement is given by the following equation:

$$-\frac{q N_d \epsilon_0 \epsilon_s}{2 C_{ox}} \cdot \frac{d}{dt}\left(\frac{C_{ox}}{C}\right)^2 = \frac{q n_i \epsilon_0 \epsilon_s}{\tau_g C_{inv}}\left(\frac{C_{inv}}{C} - 1\right) + q s n_i \quad (1)$$

wherein the symbols denote:
q: Elementary charge of an electron
Nd: Impurity density
ϵo: Permittivity in vacuum
ϵs: Dielectric constant of semiconductor
Cox: Capacitance of insulating film
C: Total capacitance of MIS diode
Cinv: Total capacitance of MIS diode under inversion conditions
ni: Intrinsic carrier density
τg: Minority carrier lifetime
s: Surface recombination Rate Equation (1) shows that a plot of the rate of change of $(C_{ox}/C)^2$ versus the value of $((C_{inv}/C)-1)$ will be a straight line. The gradient of the plotted straight line includes the minority carriers lifetime τg, as the only unknown parameter. The minority carrier lifetime τg is therefore calculated from the gradient of the straight line, which is obtained by the C-t curve measurement.

FIG. 9 is a graph showing C-t curves obtained by the conventional Zerbst method. In the examples of FIG. 9, it takes about ten minutes to measure one C-t curve. The measurement time can be shortened by reducing the bias voltage. However, as the bias voltage is reduced, the recombination of minority carriers at the insulating film-substrate interface will dominate, in the recombination processes of the minority carriers, thereby increasing the significance of the second term on the right-hand side of Equation (1), that is, (qsni). The increase of the term (qsni) obscures the linearity between the rate of change of $(C_{ox}/C)^2$ and the value of $((C_{inv}/C)-1)$, thus making it difficult to evaluate the minority carrier lifetime correctly.

SUMMARY OF THE INVENTION

An object of the present invention is to provide an improved method and apparatus for measuring the minority carrier lifetime in a semiconductor accurately and in a relatively short time.

The present invention is directed to a method of measuring a minority carrier lifetime in a semiconductor, comprising the steps of: (a) preparing a semiconductor wafer having a substrate and an insulating film formed on the substrate; (b) forming a capacitor, connected to the insulating film; (c) applying a high frequency voltage with a bias to a series combination of the semiconductor wafer and the capacitor; (d) changing the bias stepwise, while measuring a time-dependent change of a total capacitance of the series combination; and (e) calculating a minority carrier lifetime in the substrate by the analysis of the time-dependent change of the total capacitance.

The step of forming a series combination of the semiconductor wafer and the capacitor increases the voltage applied to the semiconductor substrate after the stepwise change of the bias voltage, thus widening the depletion layer related to increasing of the generation of minority carriers.

In a preferred method embodiment, step (b) comprises the steps of: forming an electrode on the insulating film; and connecting the capacitor with the electrode.

In another preferred method embodiment, step (b) comprises the steps of: supporting a test electrode separated from a surface of the insulating film to form the capacitor between the test electrode and the insulating film; measuring a distance between the test electrode and the insulating film; and calculating a capacitance of the capacitor on the basis of the distance.

Preferably, the step of measuring the distance comprises the steps of: emitting monochromatic light incident on a reflecting surface of a light transmission reflector, the reflecting surface being located substantially parallel to the surface of the insulating film, the test electrode being attached to the reflecting surface; reflecting the monochromatic light at the reflecting surface such that geometric optical total reflection occurs; measuring intensity of the monochromatic light reflected by the reflecting surface; and measuring the distance on the basis of the intensity of the reflected monochromatic light.

In still another preferred embodiment, step (b) comprises the steps of: preparing a test electrode with a dielectric body fixed on the test electrode; and placing the test electrode on the semiconductor wafer such that the dielectric body and the insulating film contact each other to thereby form the capacitor.

The present invention is also directed to an apparatus for measuring a minority carrier lifetime in a semiconductor, comprising: a metal table for mounting a semiconductor wafer, the semiconductor wafer having a substrate and an insulating film formed on a first surface of the substrate, the metal table contacting a second surface of the substrate; an electrical power supply for supplying a high frequency voltage with a bias to a series combination of the semiconductor wafer and a capacitor connected to the insulating film, and for changing the bias stepwise; measuring means for measuring a time-dependent change of a total capacitance of the series combination; and calculating means for calculating a lifetime of the minority carriers in the substrate on the basis of the time-dependent change of the total capacitance.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Basic Measuring Method

Figure 1A:
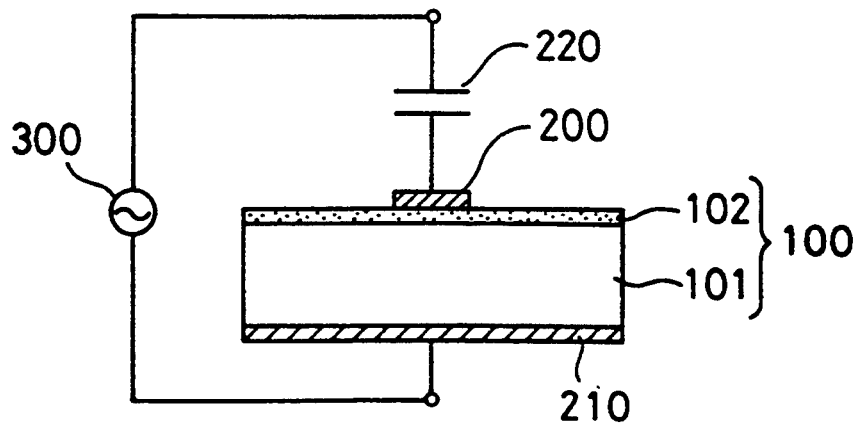
FIGS. 1A and 1B illustrate respectively the basic structure of a series combination of a semiconductor and a capacitor according to an embodiment of the present invention, and its equivalent circuit.

FIG. 1A illustrates the basic structure of a series combination of a semiconductor and a capacitor according to the present invention. A semiconductor wafer 100 includes a semiconductor substrate 101 and an insulating film 102, or an oxidation film, formed on the substrate 101. An electrode 200 is formed on the insulating film 102, and another electrode 210 is formed on the other surface of the substrate 101. The electrode 200, the insulating film 102, and the substrate 101, constitute a MIS diode. The electrode 200 is further connected with a capacitor 220. The series combination of the semiconductor wafer 100 and the capacitor 220 is connected to an electrical power supply 300, which supplies a high frequency voltage with a bias. The frequency range is from about 10 kHz to about 10 MHz. The range of bias voltages is from about 5V to about 500V.

Figure 1B:
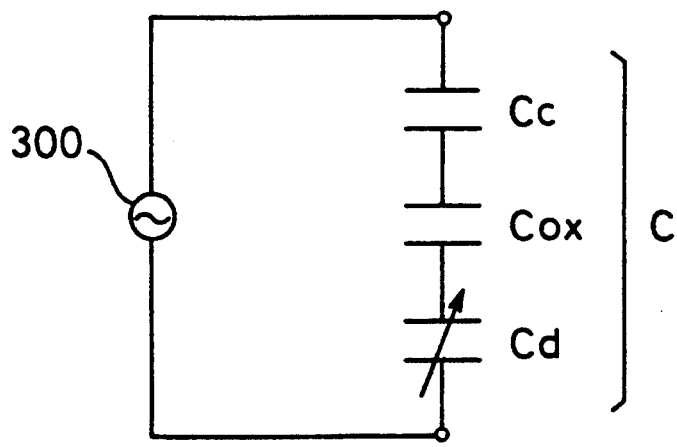

FIG. 1B shows an equivalent circuit of the structure shown in FIG. 1A. The equivalent circuit includes a series combination of a depletion-layer capacitance Cd, an oxide capacitance Cox, and a capacitance Cc of the capacitor 220. The total capacitance C of the series combination is measured while the bias voltage applied to the series combination is changed stepwise as is the case with the conventional Zerbst method. The capacitor 220 greatly reduces the measuring time for C-t curve measurement, as will be described later in detail.

Figure 8A:
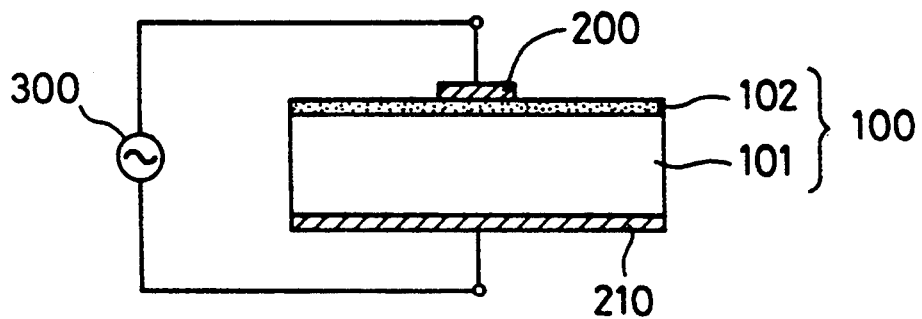
FIGS. 8A, 8B, and 8C illustrate a conventional method of measuring C-t curves.
Figure 8B:
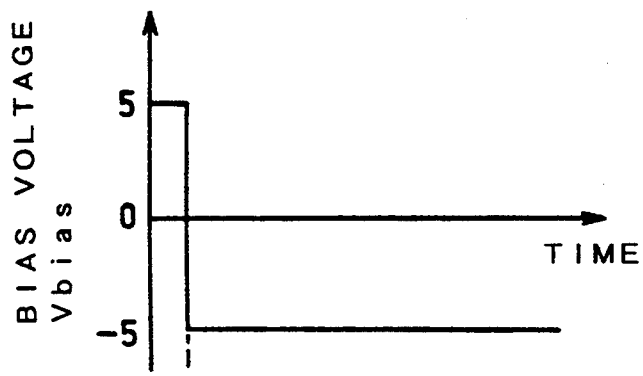

The C-t curve measurement using the structure shown in FIG. 1A differs from that using the structure shown in FIG. 8A as follows. Since Equation (1) representing the time-dependent change of the total capacitance C is a nonlinear differential equation, the total capacitance C cannot be analytically obtained. However, the change of the total capacitance C can be numerically simulated by assuming initial conditions. The inventors assumed initial conditions including the minority carrier lifetime $\tau g$, the interface recombination rate s, and the initial value of the total capacitance C. The initial value of the total capacitance C(t0) was calculated from the oxide capacitance Cox and the depletion-layer capacitance Cd, which were obtained in advance by the conventional method, and from the capacitance of the capacitor 220. In simulating a C-t curve using the structure shown in FIG. 1A, the oxide capacitance Cox in Equation (1) is replaced by the total of the oxide capacitance Cox and the capacitance Cc of the capacitor 220.

Figure 2:
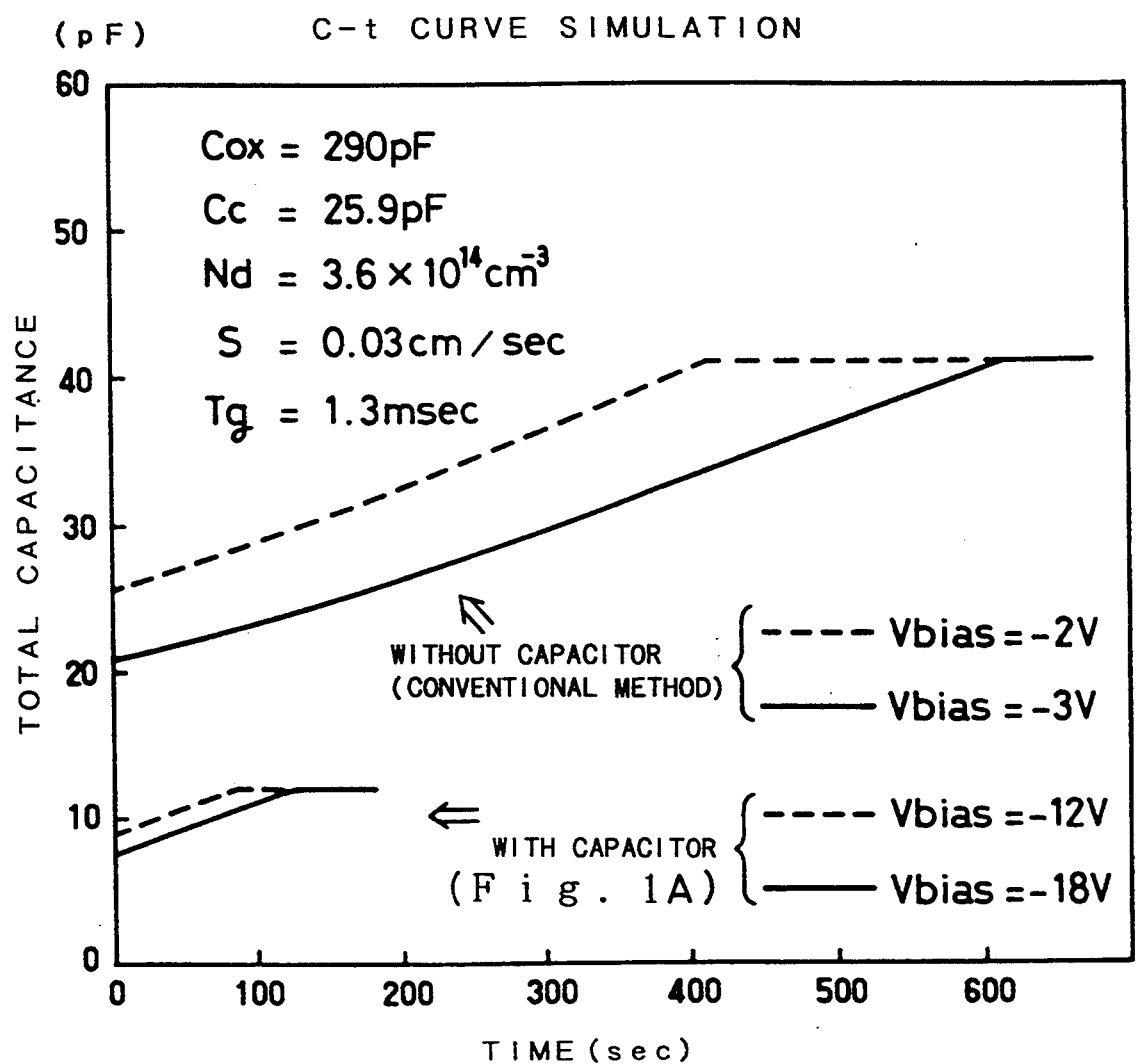
FIG. 2 is a graph showing C-t curves obtained by numerical simulation.

FIG. 2 is a graph showing C-t curves obtained by the numerical simulations using an n-type semiconductor substrate. The upper two curves in FIG. 2 are the results using the structure without the capacitor 220 shown in FIG. 8A for two different bias voltages, and the lower two curves in FIG. 2 are the results using the structure with the capacitor 220 shown in FIG. 1A. It takes about 500 seconds and about 700 seconds for the structure without the capacitor 220, and it takes only about 100 seconds and about 150 seconds for the structure with the capacitor 220. In other words, the measuring time is reduced to about one-fifth by using the capacitor 220. The bias voltages Vbias for the structure with the capacitor 220, which are −12 Volts and −18 Volts, are determined so that a voltage applied to the semiconductor wafer 100 becomes approximately equal to that for the structure without the capacitor 220 when sufficient time has elapsed, about 150 seconds, for example, after the stepwise change of the bias voltage.

Since the minority carrier lifetime $\tau g$ was assumed in the above simulations, the simulated C-t curves for the structure with the capacitor 220 indicate a precise value of the lifetime $\tau g$. The simulation results shown in FIG. 2 indicate that the measuring time according to the present invention is far shorter than that of the conventional method, and that the curves according to the present invention, which are marked "with capacitor", are shorter accordingly. A precise value of the lifetime $\tau g$ will be obtained from the shorter curves of the present invention because those curves are made with the assumed lifetime τg. Although in general, the shorter the measuring time, the lower the precision of the measurement, this simulation shows that shorter curves which are measured according to the present invention, even if there is no assumed value τg as there was in the simulation, will give the lifetime as precisely as the conventional method. In other words, the minority carrier lifetime τg can be obtained as precisely as in the conventional method even if the measuring time is greatly reduced according to the present invention.

Figure 8C:
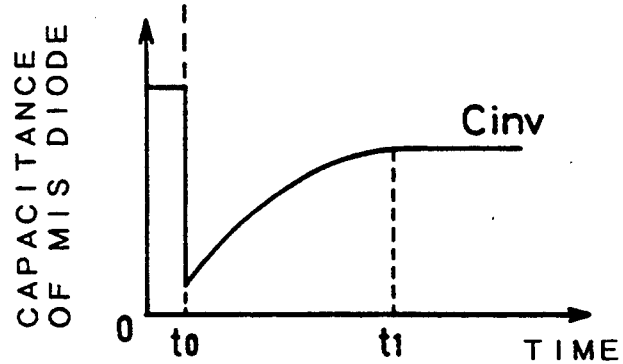

The reason why the capacitor 220 reduces the measuring time is believed to be as follows. Since a bias voltage applied to the semiconductor wafer 100 is approximately the same for both of the structures, with and without the capacitor 220, as described before, the number of the minority carriers existing near the interface between the substrate 101 and the insulating film 102 is therefore approximately equal in both of the cases, when sufficient time has elapsed and the substrate 101 is under inversion conditions. But a difference which is caused by the capacitor 220 is in the width of the depletion layer right after the stepwise change of the bias voltage; the stepwise change occurs at time zero (0) in FIG. 2, and at time t0 in FIG. 8C. At time 0 in FIG. 2, a bias voltage applied to the substrate 101 is about −2.7 Volts for the structure without the capacitor 220, and it is about −12 Volts for the structure with the capacitor 220. This means that the capacitor 220 increases the width of the depletion layer at time 0. Since minority carriers are generated in the depletion layer, the generation of the minority carriers increases proportionally to the width of the depletion layer, thus increasing the number of the minority carriers arriving at the substrate-insulating film interface. The measuring time of the C-t curve is the duration from the beginning of the test until the time at which the total capacitance is saturated. This measuring time corresponds to the duration required for accumulating a specific number of minority carriers at the substrate-insulating film interface, and it is therefore reduced by the capacitance 220. In the case of the solid line in FIG. 2, representing Vbias=−3V, the saturation time is about 500 seconds.

B. First Experiment Results

Figure 3:
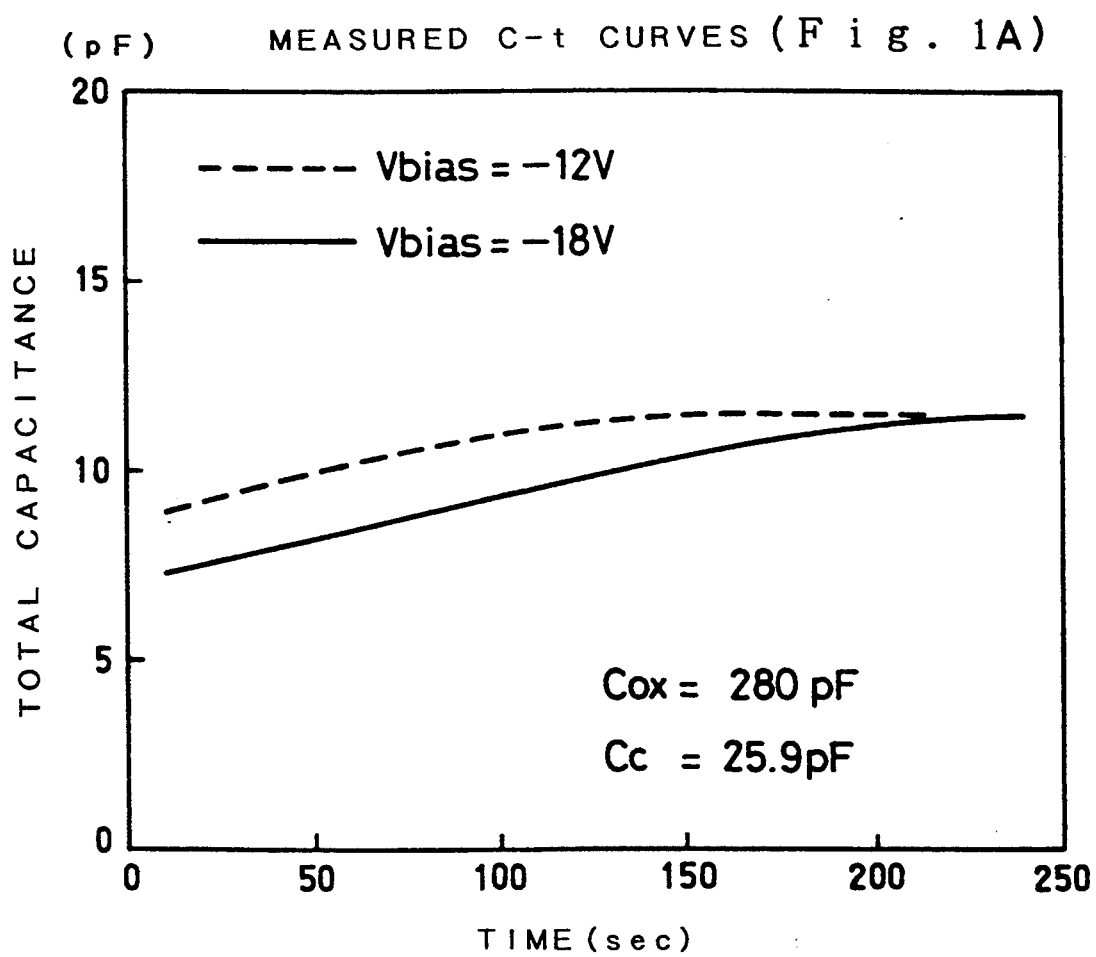
FIG. 3 is a graph showing C-t curves measured with the preferred embodiment.
Figure 9:
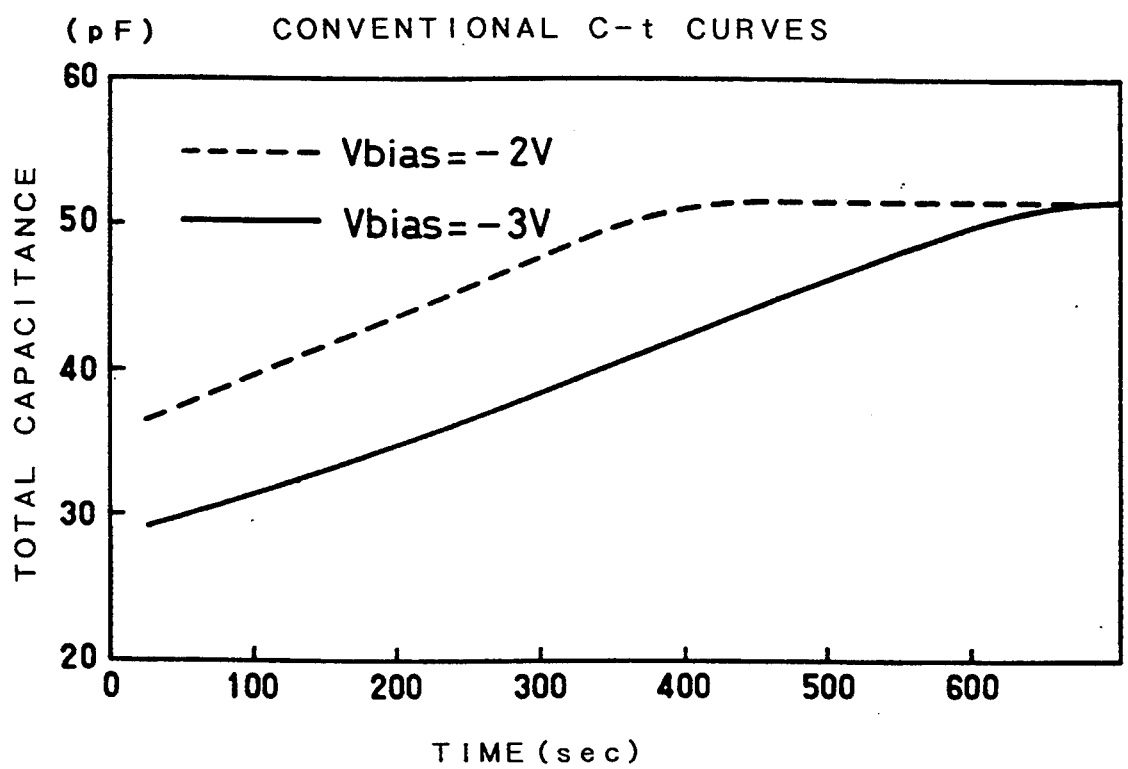
FIG. 9 is a graph showing C-t curves measured by the conventional method.

FIG. 3 is a graph showing C-t curves using an n-type semiconductor substrate. The capacitor 220 was an air variable condenser, i.e., a variable condenser using air as dielectric, with a capacitance of 25.9 pF. As shown in FIG. 3, the measuring time was about 180 seconds for one case and about 250 seconds for another. The measuring time was reduced to about one-third from that shown in FIG. 9. By executing a so-called Zerbst plot on the basis of FIG. 3, the minority carrier lifetime τg was calculated to be 1.3 msec. This value is about the same value as that measured according to the conventional method.

Any type of capacitor can be used as the capacitor 220. However, a capacitor including a dielectric other than air has the possibility of non-negligible hysteresis of the capacitance with respect to change of voltage, and the possibility that the hysteresis will influence the C-t curve measurement. Therefore capacitors including only air as the dielectric are preferable.

C. Second Experiment Results

Figure 4A:
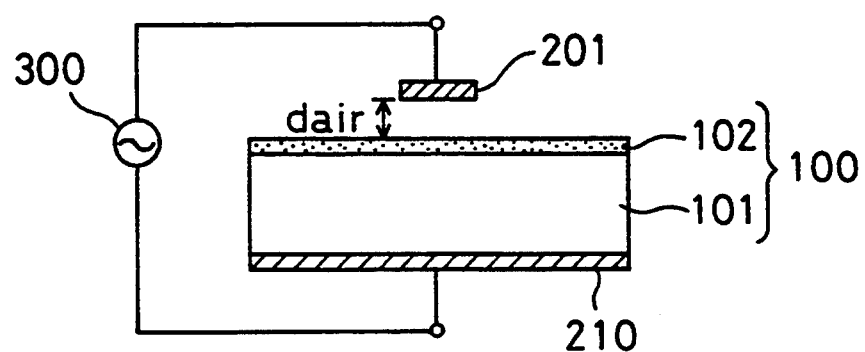
FIGS. 4A and 4B illustrate respectively another embodiment of a series combination of a semiconductor and a capacitor, and its equivalent circuit.

FIG. 4A illustrates another structure of a series combination of a semiconductor and a capacitor according to an embodiment of the present invention. A test electrode 201 is held apart from the surface of the insulating film 102 across a gap dair, for example by the apparatus shown in FIG. 5 and described below. A high frequency voltage with a bias is applied by the power supply 300 between the test electrode 201 and another electrode 210 formed on the rear surface of the substrate 101.

Figure 4B:
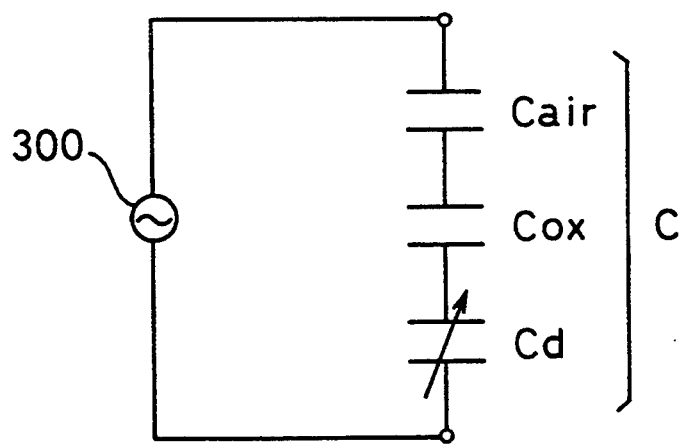

FIG. 4B illustrates an equivalent circuit of the structure shown in FIG. 4A. The equivalent circuit is the same as that shown in FIG. 1B except that the capacitance Cc in FIG. 1B is replaced by a gap capacitance Cair. In other words, the air gap dair performs the same function as the capacitor 220 in FIG. 1A.

Figure 5:
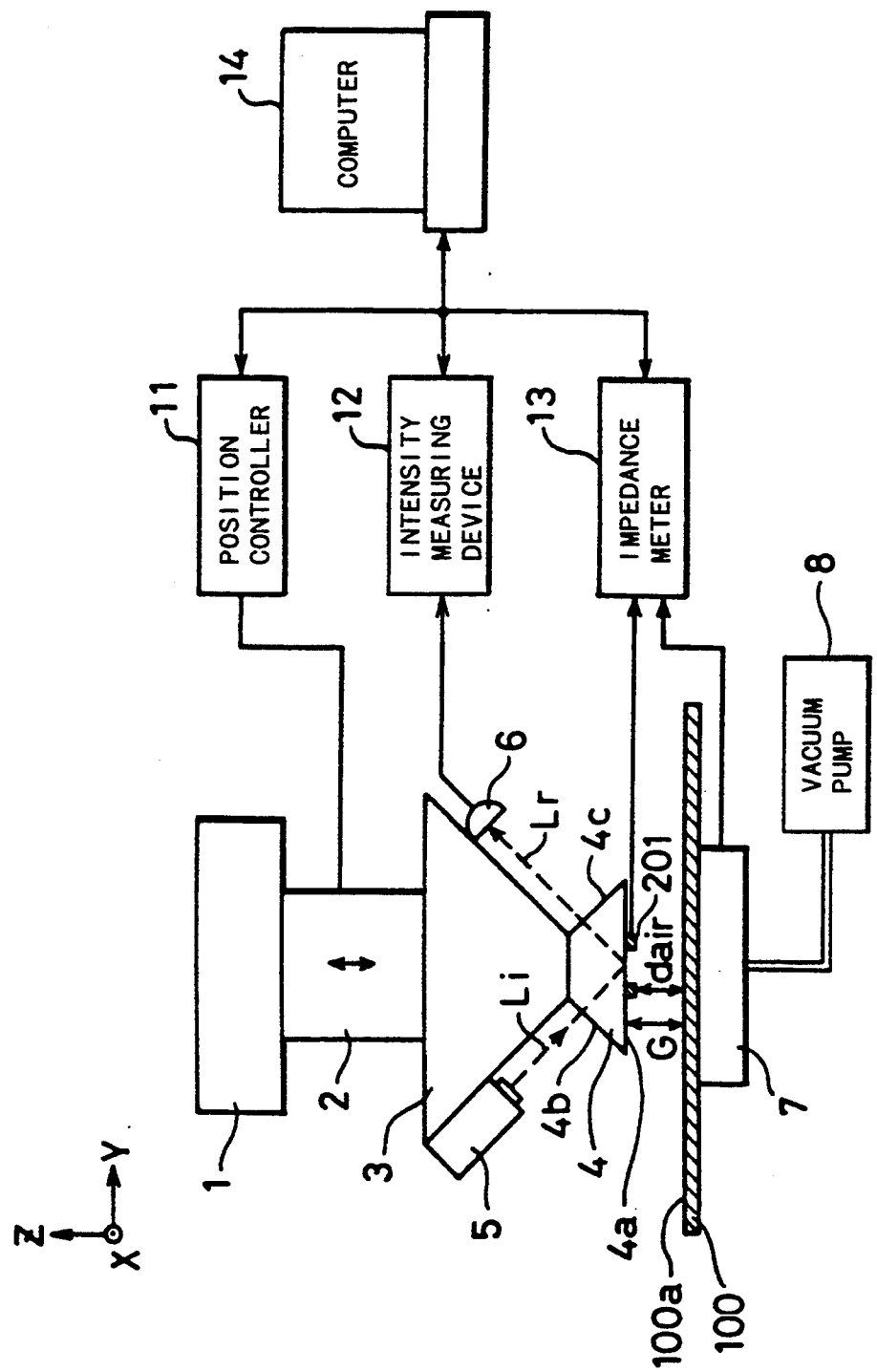
FIG. 5 is a block diagram of a non-destructive measuring apparatus for measuring C-t characteristics.

FIG. 5 is a block diagram of a non-destructive measuring apparatus for executing a C-t curve measurement with the structure shown in FIG. 4A.

The apparatus has a base 1, a piezoelectric actuator 2 attached under the base 1, and a stand 3 having the shape of an inverted trapezoid is further mounted under the piezoelectric actuator 2. A prism 4 is provided on the bottom of the stand 3. A laser source 5 such as a GaAlAs laser, and a photosensor 6 such as a photodiode, are fixed respectively near the upper ends of the opposite slanted faces of the stand 3.

A bottom surface 4a of the prism 4 is held substantially parallel to the surface of a metal table 7, which is an x-y plane and on which a semiconductor wafer 100 is mounted. The test electrode 201 in the shape of a ring is formed on the bottom surface 4a of the prism 4. The semiconductor 100 is mounted on the table 7 below the prism 4 and separated from the prism 4 across a gap G. The surface of the semiconductor wafer 100 is set parallel to the bottom surface 4a of the prism 4.

The non-destructive measuring apparatus measures the gaps G and dair by utilizing evanescent light emitted from the bottom surface 4a of the prism 4 under geometrical total optical reflection conditions. The detailed structure of the non-destructive measuring apparatus and the method of measuring the gap are described in a commonly owned copending U.S. application Ser. No. 07/764,493, allowed, the disclosure of which is incorporated by reference herein.

The piezoelectric actuator 2 is controlled by a position controller 11 to move the stand 3 in the z direction. The photosensor 6 is connected to an intensity measuring device 12, and the test electrode 201 and the table 7 are connected to an impedance meter 13, which can measure reactance, capacitance, and resistance. In this embodiment, the impedance meter 13 measures the total capacitance between the test electrode 201 and the metal table 7.

The position controller 11, the intensity measuring device 12, and the impedance meter 13 are connected to a computer 14 such as a personal computer, which controls the whole apparatus and processes measured data transmitted from the devices 11, 12, and 13.

Figure 6:
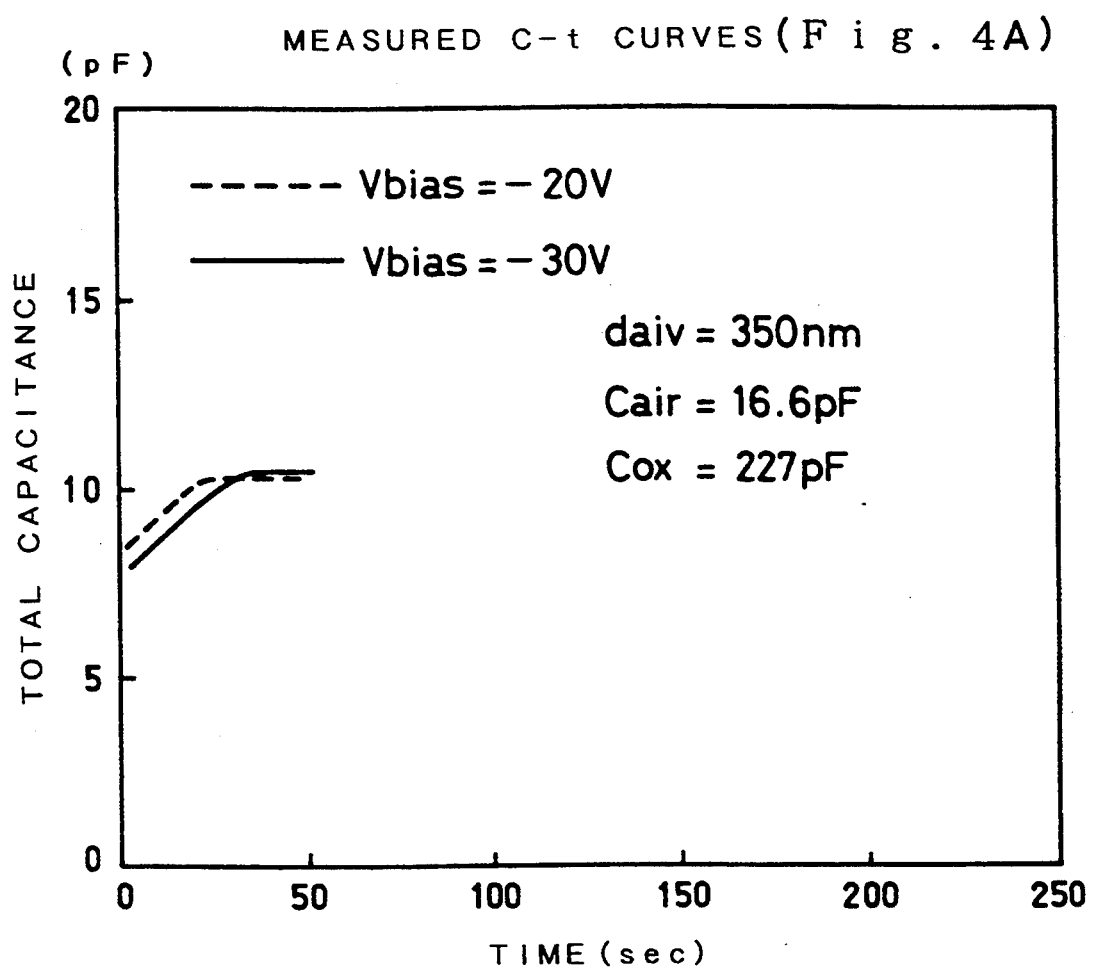
FIG. 6 is a graph showing C-t curves measured with the structure of FIG. 4A.

FIG. 6 is a graph showing the results of C-t measurement executed with the apparatus shown in FIG. 5. The same n-type semiconductor was used in this experiment as in the measurement of FIG. 3. The gap dair between the test electrode 201 and the semiconductor wafer 100 was set to be 350 nm. The measuring time was about 30 seconds for one case, and about 40 seconds for another in FIG. 6. The measuring time was about one-twentieth of that of the conventional results shown in FIG. 9. By executing the Zerbst plot from the results of FIG. 6, the minority carrier lifetime was calculated to be 1.2 msec, which was a reasonable value.

Figure 7A:
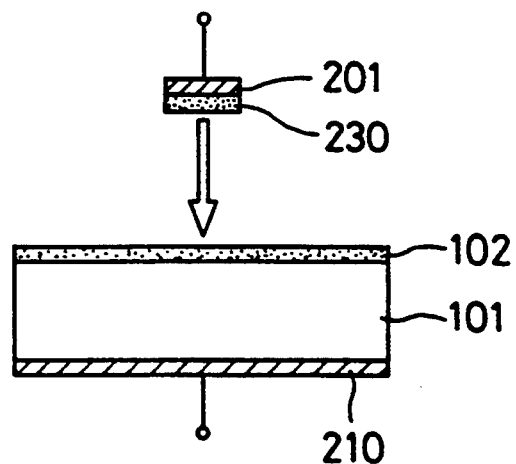
FIGS. 7A and 7B illustrate a method for making another embodiment of a series combination of a semiconductor and a capacitor according to the present invention.
Figure 7B:
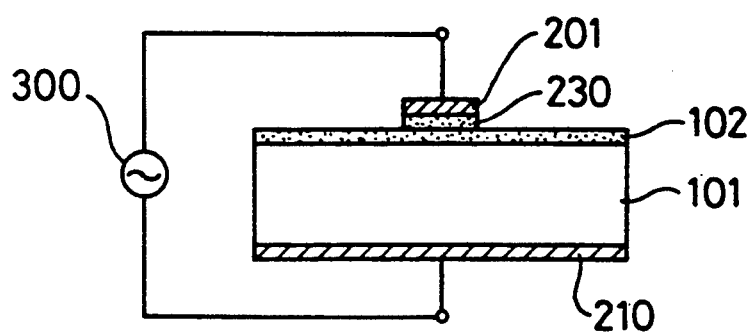

FIG. 7A and 7B illustrate another method of forming a capacitor on an insulating film 102 of a semiconductor wafer 100. In FIG. 7A, a dielectric 230 is fixed under the test electrode 201. The electrode 201 with the dielectric 230 is moved down onto the insulating film 102 of the semiconductor wafer so that the dielectric 230 and the insulating film 102 contact each other to make the structure shown in FIG. 7B. The structure of FIG. 7B has the same equivalent circuit as those shown in FIGS. 1A and 4A. The method shown in FIGS. 7A and 7B provides a simple way to form a capacitor of a fixed capacitance between the test electrode 201 and the insulating film 102 of the semiconductor wafer, just by putting the test electrode 201 with the dielectric 230 on the wafer. The overall measuring time can be reduced accordingly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of measuring the minority carrier lifetime in a semiconductor, comprising the steps of:
   (a) preparing a semiconductor wafer having a substrate and an insulating film formed on said substrate;
   (b) forming a series combination of said semiconductor wafer and a capacitor;
   (c) applying a high-frequency voltage with a bias to said series combination of said semiconductor wafer and said capacitor;
   (d) changing said bias stepwise while measuring a time-dependent change, responsive to said stepwise change of said bias, of a total capacitance of said series combination; and
   (e) calculating a minority carrier lifetime in said substrate by the analysis of said time-dependent change of said total capacitance.

2. A method in accordance with claim 1, wherein said step (b) comprises the steps of:
   forming an electrode on said insulating film; and
   connecting said capacitor with said electrode.

3. A method in accordance with claim 1, wherein said step (b) comprises the steps of:
   supporting a test electrode spaced from a surface of said insulating film to form said capacitor between said test electrode and said insulating film;
   measuring a distance between said test electrode and said insulating film; and
   calculating a capacitance of said capacitor on the basis of said distance.

4. A method in accordance with claim 3, wherein said step of measuring said distance comprises the steps of:
   emitting monochromatic light and directing said light so that said light is incident on a reflecting surface which is located substantially parallel to said surface of said insulating film, said test electrode being associated in fixed relationship with said reflecting surface;
   reflecting said monochromatic light at said reflecting surface;
   measuring an intensity of said monochromatic light reflected by said reflecting surface; and
   measuring said distance on the basis of said intensity of said reflected monochromatic light.

5. A method in accordance with claim 1, wherein said step (b) comprises the steps of:
   preparing a test electrode having a dielectric body fixed on said test electrode; and
   placing said test electrode on said semiconductor wafer such that said dielectric body and said insulating film contact each other to thereby form said capacitor.

6. An apparatus for measuring a minority carrier lifetime in a semiconductor, comprising:
   a table for receiving a semiconductor wafer, said semiconductor wafer having a substrate and an insulating film formed on a first surface of said substrate, said table having conductive means for contacting a second surface of said substrate;
   means for forming a series combination of a capacitor and said semiconductor wafer;
   an electric power supply which is arranged for supplying a high-frequency voltage with a bias to said series combination of said semiconductor wafer and said capacitor connected to said insulating film, and for changing said bias stepwise;
   measuring means for measuring a time-dependent change of a total capacitance of said series combination in response to said stepwise bias change; and
   calculating means for calculating a minority carrier lifetime in said substrate on the basis of said time-dependent change of said total capacitance.

7. An apparatus in accordance with claim 6, wherein said conductive means is a metal portion of said table disposed for contacting said second main surface of said substrate.

8. An apparatus in accordance with claim 6, further comprising an electrode formed on said insulating film, said electrode being disposed for being connected with said capacitor.

9. An apparatus in accordance with claim 6, further comprising:
   electrode supporting means for supporting a test electrode spaced from a surface of said insulating film so as to form said capacitor between said test electrode and said insulating film;
   distance measuring means for measuring a distance between said test electrode and said insulating film; and
   capacitance calculating means for calculating a capacitance of said capacitor on the basis of said distance.

10. An apparatus in accordance with claim 9, wherein said distance measuring means comprises:
    a light source for emitting monochromatic light;
    a light reflecting surface located substantially parallel to said surface of said insulating film for reflecting said monochromatic light at said reflecting surface, wherein said test electrode is arranged in fixed relation to said reflecting surface; and
    a photosensor for measuring an intensity of said monochromatic light reflected by said reflecting surface.

11. An apparatus in accordance with claim 10, wherein said reflecting surface is comprised in a light transmission reflector.

12. An apparatus in accordance with claim 11, wherein said photosensor is disposed for measuring said intensity when geometric total optical reflection occurs in said light transmission reflector.

13. An apparatus in accordance with claim 10, wherein said test electrode is attached to said reflecting surface.

14. An apparatus in accordance with claim 6, further comprising:

electrode supporting means for supporting a test electrode with a dielectric body fixed on said electrode, and for placing said test electrode on said semiconductor wafer such that said dielectric body and said insulating film contact each other to thereby form said capacitor between said test electrode and said insulating film.

* * * * *